United States Patent
Kobayashi

(10) Patent No.: US 9,203,201 B2
(45) Date of Patent: Dec. 1, 2015

(54) TERMINAL MANUFACTURING METHOD

(71) Applicant: Sumitomo Wiring Systems, Ltd., Yokkaichi, Mie (JP)

(72) Inventor: Kazumasa Kobayashi, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 117 days.

(21) Appl. No.: 13/866,072

(22) Filed: Apr. 19, 2013

(65) Prior Publication Data

US 2013/0288533 A1   Oct. 31, 2013

(30) Foreign Application Priority Data

Apr. 27, 2012   (JP) ................................ 2012-102554

(51) Int. Cl.

| | |
|---|---|
| *H01R 43/16* | (2006.01) |
| *H01R 43/02* | (2006.01) |
| *H01R 12/58* | (2011.01) |
| *H01R 13/03* | (2006.01) |
| *B21C 1/02* | (2006.01) |
| *B21C 3/00* | (2006.01) |
| *H01R 12/71* | (2011.01) |
| *H05K 3/34* | (2006.01) |

(52) U.S. Cl.
CPC ............. *H01R 43/0256* (2013.01); *B21C 1/02* (2013.01); *B21C 3/00* (2013.01); *H01R 12/585* (2013.01); *H01R 12/71* (2013.01); *H01R 13/03* (2013.01); *H01R 43/16* (2013.01); *H05K 3/3415* (2013.01); *Y10T 29/49153* (2015.01)

(58) Field of Classification Search
CPC ...... H01R 12/585; H01R 12/71; H01R 13/03; H01R 43/16; H01R 43/0256; B21C 1/02; B21C 3/00; H05K 3/3415; Y10T 29/49153; Y10T 29/49151; Y10T 29/49218
USPC ............ 29/842–845, 882, 884, 874; 174/262, 174/267; 439/83, 886
See application file for complete search history.

(56) References Cited

U.S. PATENT DOCUMENTS

| | | | | |
|---|---|---|---|---|
| 3,601,750 | A * | 8/1971 | Mancini | 439/84 |
| 4,832,622 | A * | 5/1989 | Zahn | 29/874 |
| 5,083,928 | A * | 1/1992 | Aikens et al. | 439/82 |
| 5,122,075 | A | 6/1992 | Kile | |
| 6,406,338 | B1 * | 6/2002 | Endo et al. | 29/882 |
| 2002/0146921 | A1 | 10/2002 | Lu et al. | |

FOREIGN PATENT DOCUMENTS

| | | |
|---|---|---|
| GB | 1210363 | 10/1970 |
| JP | 2010-277889 | 12/2010 |

* cited by examiner

*Primary Examiner* — Donghai D Nguyen
(74) *Attorney, Agent, or Firm* — Gerald E. Hespos; Michael J. Porco; Matthew T. Hespos

(57) ABSTRACT

A manufacturing method is provided for a terminal (10) that has a board connecting portion (12) to be connected to a circular through hole (B1) formed to penetrate through a board (B). The manufacturing method includes a wire drawing step of manufacturing a wire material having a polygonal cross-section with obtuse interior angles by drawing the wire material through an opening of a wire drawing die, the opening having a polygonal shape with obtuse inner angles. The method then includes a surface processing step of applying a surface processing to the wire material, and a cutting step of cutting the wire material having the surface processing applied thereto to a specified length to form the terminal (10).

14 Claims, 9 Drawing Sheets

TERMINAL MANUFACTURING METHOD

BACKGROUND

1. Field of the Invention

The invention relates to a terminal manufacturing method and a board connector.

2. Description of the Related Art

Japanese Unexamined Patent Publication No. 2010-277889 discloses a terminal that is to be inserted into a circular through hole that penetrates through a board and then soldered. The terminal is formed by cutting a wire material as a base material having a square cross-section and having a surface processing applied thereto to a specified length and pressing the cut wire material. Corner parts of the terminal in the cross-section of the terminal are closest to the inner wall of the through hole. Therefore a diameter of the through hole is determined in conformity with the cross-sectional shape of the terminal. On the other hand, a middle part of each side of the cross-section of the terminal is most distant from the inner wall of the through hole so that a large amount of solder is filled. Flow soldering causes solder to be sucked up into the interior of the through hole from a melted solder bath. Therefore intervals between terminals can be made smaller even if the amount of necessary solder increases.

Reflow soldering passes a board through a reflow oven after solder paste is printed on a surface of the board. The solder paste needs to be printed in a range wider than a land of the through hole after adjusting the amount of solder to be flowed into the through hole. Intervals between the through holes have to be set so that respective areas of the solder paste do not overlap. Thus, to reduce the intervals between the terminals, it is necessary to reduce each printed range of the solder paste as small as possible by reducing the amount of solder as much as possible.

The invention was completed in view of the above situation and an object thereof is to make each printed range of solder paste smaller by reducing the amount of solder required for connection in reflow soldering, thereby making intervals between terminals smaller.

SUMMARY OF THE INVENTION

The invention relates to a manufacturing method for a terminal including a board connecting portion to be connected to a circular through hole that penetrates through a board. The method includes a wire drawing step of manufacturing a wire material having a polygonal cross-section with obtuse interior angles by drawing the wire material through an opening of a wire drawing die, the opening having a polygonal shape with obtuse inner angles. The method then includes a surface processing step of at least partly applying a surface processing to the wire material. The method further includes a cutting step of cutting the wire material having the surface processing applied thereto to a specified length to form the terminal.

The invention avoids the need to form a polygonal shape by striking corner parts in a square cross-section and the surface processing applied to the surface of the wire material remains intact because of the use of the wire material having the polygonal cross-section with the obtuse interior angles.

Thought has been given to obtaining a polygonal shape by striking corner parts in a square cross-section, but it is not advisable since the surface processing applied to the corner portions is affected by striking and solder becomes difficult to adhere to the corner portions. In contrast, the manufacturing method of the invention merely requires forming the terminal using the polygonal wire material as a base material and it is not necessary to strike the corner parts. Hence, the surface processing remains intact.

The invention also relates to a manufacturing method for a terminal including a board connecting portion to be connected to a circular through hole that penetrates through a board. The method includes a wire drawing step of manufacturing a wire material having a substantially rectangular cross-section with rounded corner parts by drawing the wire material through an opening of a wire drawing die. The opening has a substantially rectangular shape with rounded four corners. The method also includes a surface processing step of at least partly applying a surface processing to the wire material; and a cutting step of cutting the wire material having the surface processing applied thereto to a specified length to form the terminal.

The method avoids the need to form a rectangular shape by striking corner parts in a square cross-section and the surface processing applied to the surface of the wire material remains intact because of the use of the wire material having the substantially rectangular cross-section with the rounded corner parts.

The wire material in the above manufacturing methods may include a pair of parallel surfaces.

The methods enable the terminal and a mating terminal to be connected by tightly holding the pair of parallel surfaces by the mating terminal.

The invention further relates to a manufacturing method for a terminal including a board connecting portion to be connected to a circular through hole that penetrates through a board. The method includes a wire drawing step of manufacturing a wire material having a circular cross-section by drawing the wire material through a circular opening of a wire drawing die. The method then includes a surface processing step of applying a surface processing to the wire material; and a cutting step of cutting the wire material having the surface processing applied thereto to a specified length to form the terminal.

The method avoids the need to form a circular shape by striking corner parts in a square cross-section and the surface processing applied to the surface of the wire material remains intact by using the wire material having the circular cross-section.

The surface processing may comprise applying tin plating to the wire material.

The wire material used as a base material may be made of copper or copper alloy.

The wire material may be shaped to taper a leading end part of the board connecting portion and/or to bend the terminal fitting to substantially have an L shape.

The invention also relates to a board connector, comprising terminals to be inserted into circular through holes that penetrate through a board; and a housing for holding the terminals. Each terminal has a board connecting portion to be connected to the through hole and a terminal connecting portion to be connected to a mating terminal provided in a mating housing to be connected to the housing. Each terminal is formed by processing a metal wire material that includes a pair of parallel surfaces and has a polygonal cross-section with obtuse interior angles.

According to this configuration, a diameter of the through holes can be made smaller and the amount of solder required for connection can be reduced as compared with the case where the terminals are formed by cutting the wire material having a square cross-section since the cross-section of the wire material is polygonal and the respective interior angles are obtuse angles. Thus, each printed range of solder paste can be made smaller in the case of reflow soldering the through holes, and intervals between the terminals can be made smaller. Further, since the wire material including the pair of parallel surfaces is used, the terminal and a mating terminal can be connected by tightly holding the pair of parallel surfaces by the mating terminal.

According to the above, it is possible to make each printed range of solder paste smaller by reducing the amount of solder required for connection in reflow soldering, thereby making intervals between terminals smaller.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
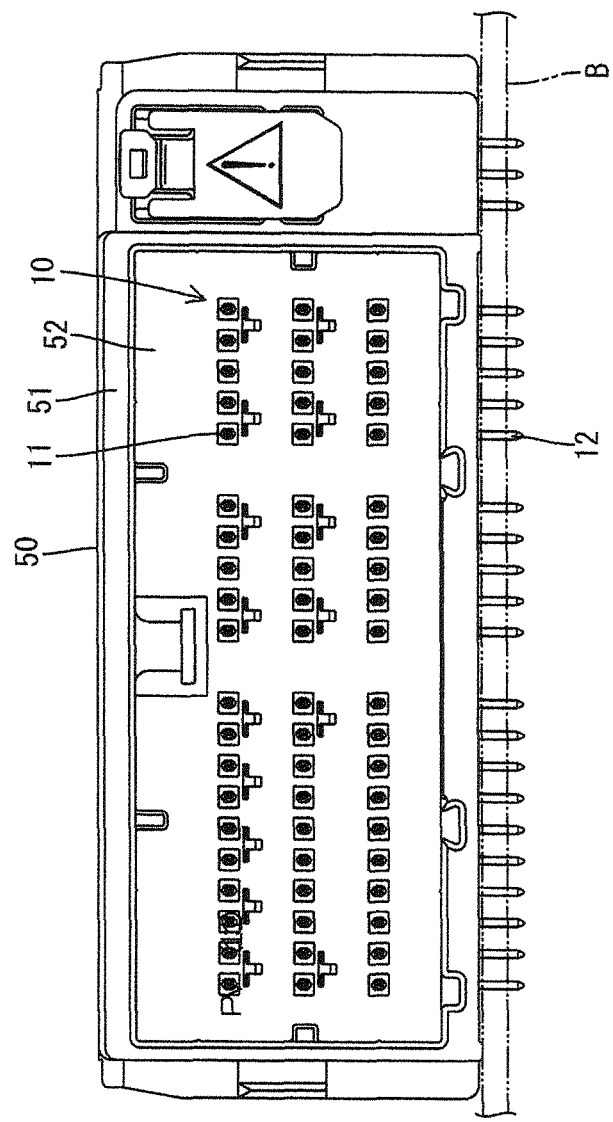
FIG. 1 is a front view of a board connector in a first embodiment.
Figure 2:
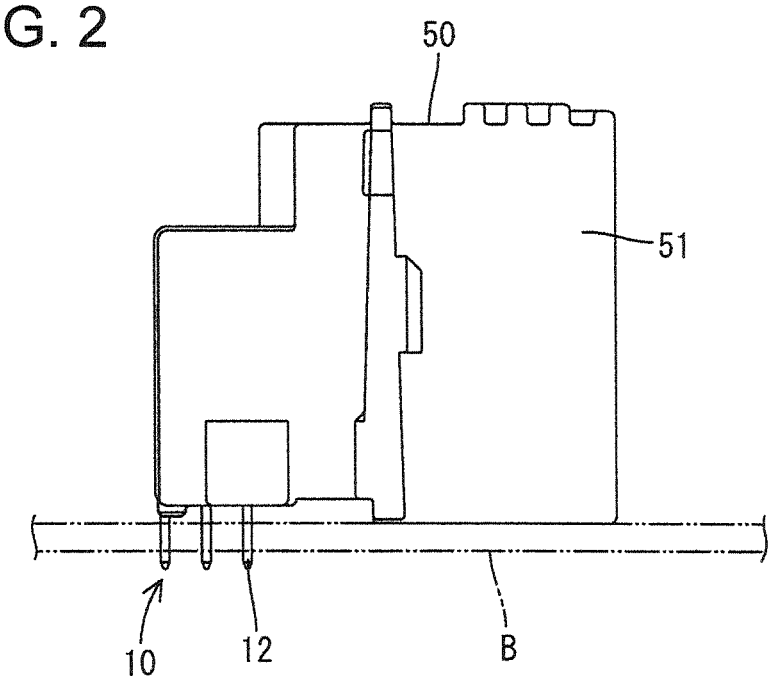
FIG. 2 is a left side view of the board connector.
Figure 3:
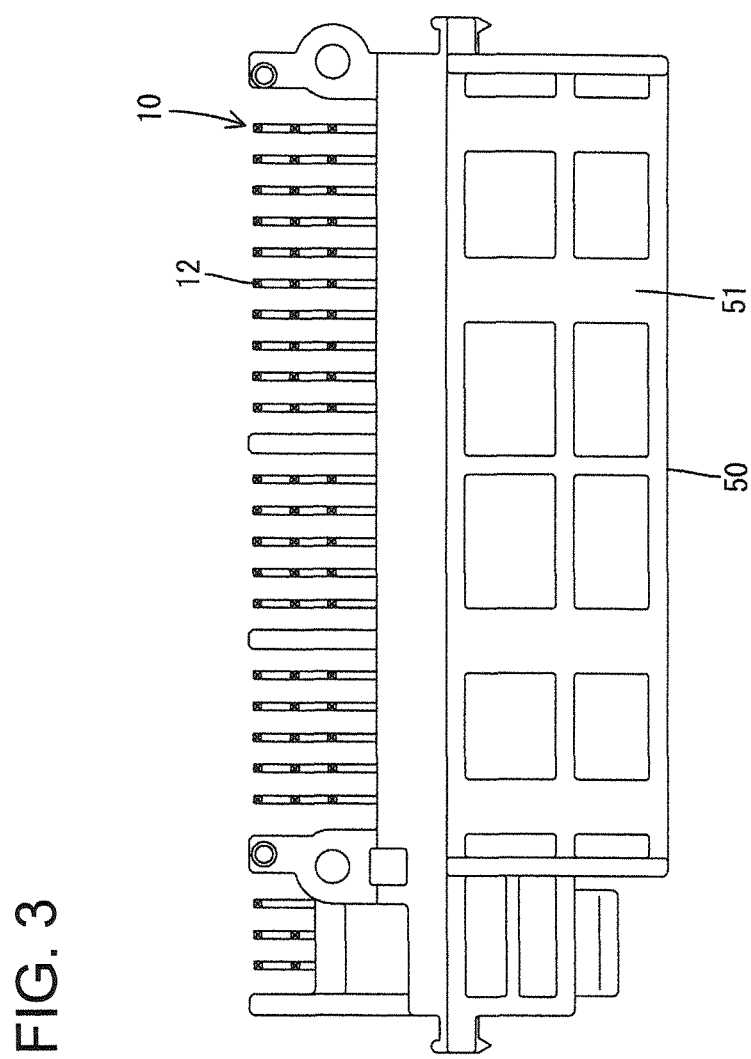
FIG. 3 is a bottom view of the board connector.

A first embodiment of the invention is described with reference to FIGS. 1 to 8. A connector in this embodiment is a board connector to be mounted on a board B and includes a housing 50 made e.g. of synthetic resin and one or more, particularly a plurality of terminals 10 held in the housing 50 as shown in FIG. 1. The housing 50 includes a receptacle 51 which is open forward, and the plurality of terminals 10 specifically are arranged in vertical and/or lateral directions (or substantially side by side in one or more stages or levels) while projecting forward from a back wall 52 of the receptacle 51. A mating connector (not shown) is fittable into the receptacle 51.

The terminal 10 is formed, such as by cutting a wire material as a base material made e.g. of copper or copper alloy and having a surface processing such as tin plating applied thereto to a specified length and pressing the cut wire material. This terminal 10 includes a terminal connecting portion 11 to be projecting forward from the back wall 52 of the receptacle 51 and a board connecting portion 12 to be projecting laterally or downward from a wall surface such as the back wall 52 of the receptacle 51. When the mating connector is fitted into the receptacle 51, mating terminals provided in the mating connector are electrically conductively connected to the terminal connecting portions 11.

The mating terminal has a substantially box portion in the form of a substantially rectangular or polygonal tube and a resilient contact piece is formed the box portion although not shown. When being fitted into the box portion, the terminal 10 is sandwiched between the resilient contact piece and a ceiling wall arranged to face the resilient contact piece. The terminal connecting portion 11 of the terminal 10 includes a lower contact surface 13 to be held in contact with the resilient contact piece and an upper contact surface 14 to be held in contact with the ceiling wall, and the lower and upper contact surfaces 13, 14 are substantially parallel. Note that since the terminal 10 is made of the same wire material, not only the terminal connecting portion 11, but also the board connecting portion 12 includes the lower and upper contact surfaces 13, 14.

Figure 4:
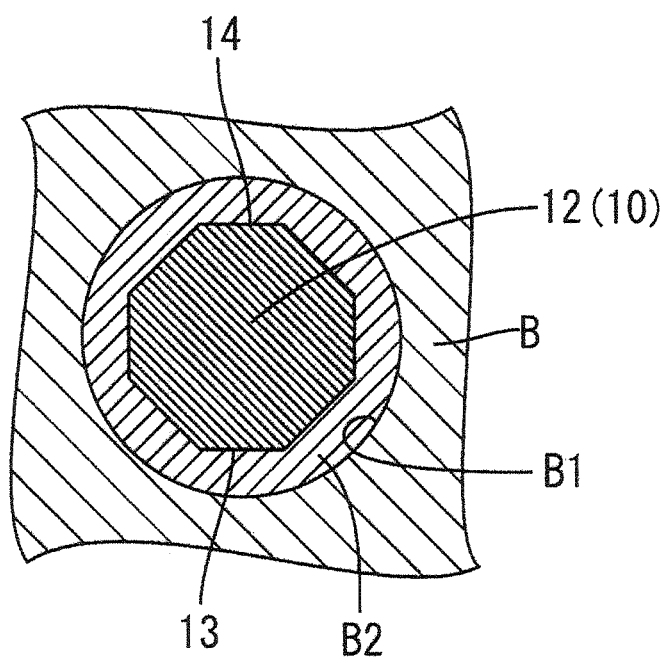
FIG. 4 is a lateral section of a connecting part of a board connecting portion and a through hole.

As shown in FIG. 4, the terminal 10 of this embodiment has a regular octagonal or polygonal cross-section. FIG. 4 is a section showing a state where the board connecting portion 12 is to be inserted in a through hole B1 formed to penetrate through the board B and connected by solder B2. A distance between the lower and upper contact surfaces 13, 14 of the board connecting portion 12 is less than about 1 mm, for example, 0.64 mm. In this case, a cross-sectional area of the board connecting portion 12 is, for example, 0.320 mm2. On the other hand, a diameter of the through hole B1 is less than about 1.2 mm, for example, 0.9 mm.

The wire material as the base material of the terminal 10 is a metal wire material produced particularly by hot wire drawing or cold wire drawing. Here, a wire drawing die used for a wire drawing operation is formed with a regular octagonal or polygonal opening and the wire material having the regular octagonal or polygonal cross-section is formed when being drawn through this opening. Thus, it is not necessary to form a wire material having a regular octagonal or polygonal cross-sectional shape particularly by striking corner parts of a wire material e.g. having a square cross-sectional shape. Since a surface processing such as tin plating is normally applied to a wire material, tin may be peeled off if the tin-plated corner parts are struck. In that respect, according to the above manufacturing method, tin on the corner parts is not peeled off and solder can reliably adhere to the surface of the board connecting portion 12.

Figure 5:
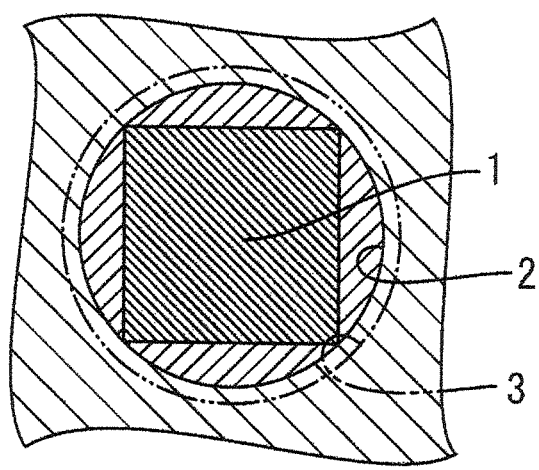
FIG. 5 is a section of a board connecting portion and a through hole in the case of using a terminal made of a wire material having a square cross-section.

The distance (e.g. 0.64 mm) between the lower and upper contact surfaces 13, 14 needs to be constant so that the resilient contact piece of the mating terminal is resiliently deformed by a specified amount. If a board connecting portion 1 is formed to have a square cross-sectional shape as shown in FIG. 5, a minimum diameter of a through hole 2 which enables the insertion of this board connecting portion 1 particularly needs to be set to less than about 1 mm, for example, at 0.905 mm. In this case, a cross-sectional area of the board connecting portion 1 is 0.401 mm2. However, if the diameter of the through hole 2 is 0.905 mm, corner parts of the board connecting portion 1 come into contact with the inner wall of the through hole 2. Thus, a through hole 3 (shown by dashed-dotted line in FIG. 5) larger than the through hole 2 has to be formed. A diameter of the through hole 3 is, for example, 1 mm.

Specifically, if the distance between the lower and upper contact surfaces 13, 14 is constant, the diameter of the through hole can be made smaller in the case of forming the board connecting portion 12 having the regular octagonal cross-sectional shape or polygonal cross-sectional shape having five or more sides than in the case of forming the board connecting portion 1 having the square cross-sectional shape. Thus, intervals between through holes can be made smaller and those between the terminals can be made smaller. Further, if the diameter of the through hole is made smaller, the amount of solder necessary to connect the through hole B1 and the board connecting portion 12 is reduced. In this way, printed ranges of solder paste applied on the through holes B1 in the case of solder connection particularly by reflowing can be made smaller and the intervals between the terminals can be made smaller.

This embodiment is configured as described above. Next, an example of a manufacturing method for the terminal 10 is described using FIGS. 6 to 8. First, a wire material having a polygonal cross-sectional shape is formed by drawing the wire material through the opening of the wire drawing die and tin plating is applied to this wire material. Subsequently, the tin-plated wire material is cut to a specified length. This wire material is shaped (particularly struck or hammered) to substantially taper a leading end part 15 of the board connecting portion 12 and particularly bent e.g. to substantially have an L shape as a whole.

Figure 6:
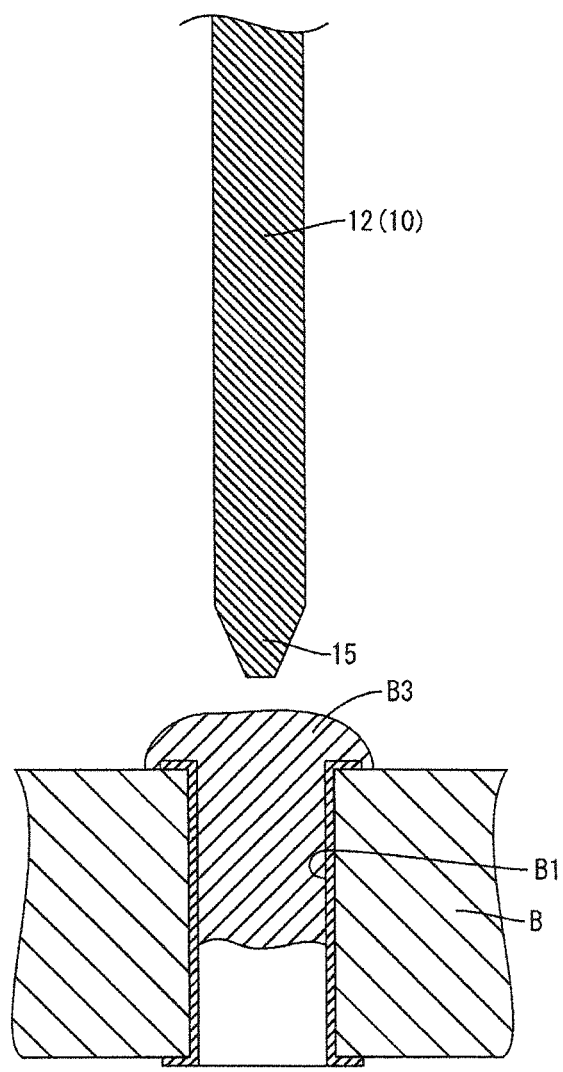
FIG. 6 is a section showing a state before a terminal is inserted into the through hole.
Figure 7:
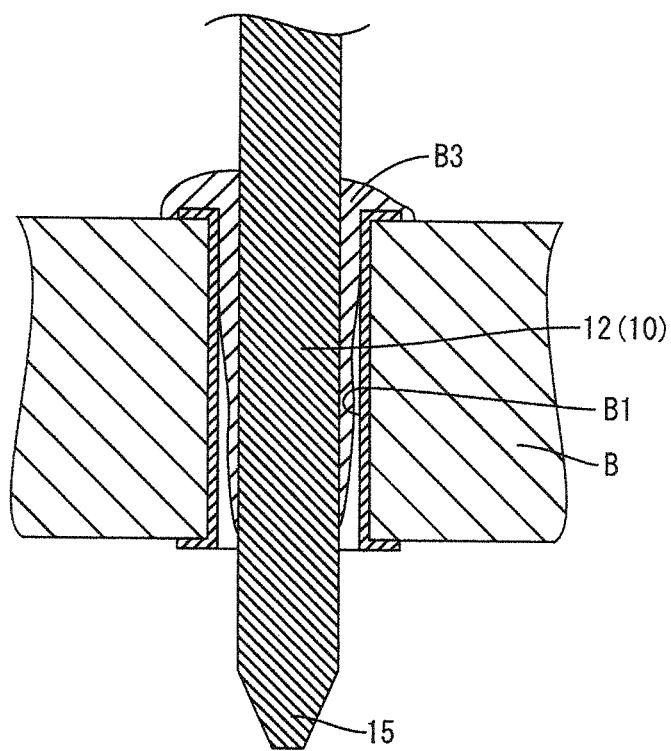
FIG. 7 is a section showing a state after the terminal is inserted into the through hole.
Figure 8:
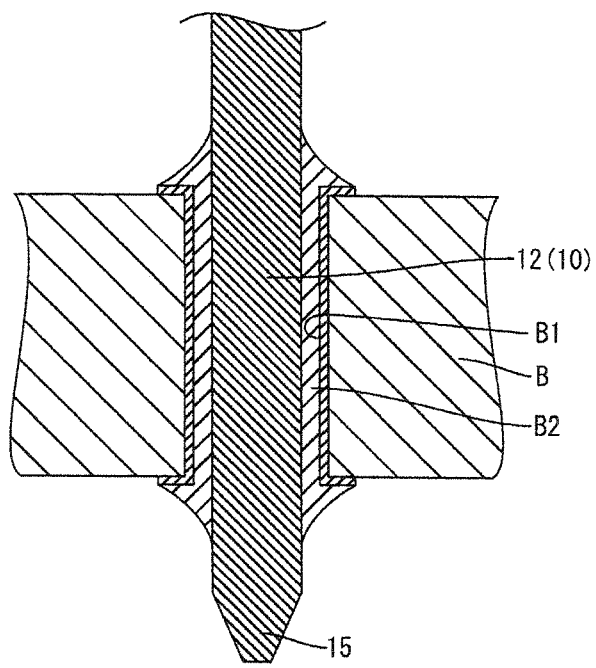
FIG. 8 is a vertical section of the connecting part of the terminal and the through hole after reflowing.

Next, a method for reflow connecting the board connecting portion 12 to the through hole B1 by the solder B2 is described. First, after the board B is placed on a board table of a printing machine and fixed, a mask formed with substantially rectangular holes at the positions of the through holes B1 is tightly attached onto the board B. Then, a squeezer is pressed against the mask and moved to put solder paste into the rectangular holes, whereby the solder paste is printed on the through holes B1. As shown in FIG. 6, solder paste B3 is printed in a range wider than a land of the through hole B1. When the board connecting portion 12 is inserted into the through hole B1, a part of the solder paste B3 is pushed into the through hole B1 as shown in FIG. 7. When the board B is subsequently passed through a reflow oven and heated, the solder B2 is formed and fillets are formed on land parts on both upper and lower sides of the through hole B1 as shown in FIG. 8.

Note that since the leading end part 15 of the board connecting portion 12 particularly is shaped (e.g. struck) and tapered when the terminal 10 is manufactured and tin is peeled off when the leading end part 15 is shaped (e.g. struck), the solder B2 is difficult to adhere to the leading end part 15. In this way, the adhesion of the solder B2 to the leading end part 15 can be suppressed and the through hole B1 and the board connecting portion 12 can be connected using a small amount of the solder B2. Thus, the printed range of the solder paste B3 can be made smaller by reducing the amount of the solder B2.

As described above, since the terminal 10 particularly having the octagonal cross-section is used in this embodiment, each printed range of the solder paste B3 is made smaller by reducing the amount of the solder B2 required for connection in reflow soldering of the through hole B1, with the result that the intervals between the terminals can be made smaller. Further, since it is not necessary to form the octagonal cross-section by striking the corner parts of the wire material having the square cross-sectional shape, tin plating is not peeled off and a difficult processing of striking the corner parts is not necessary, which is advantageous also in dimensional accuracy.

Figure 9:
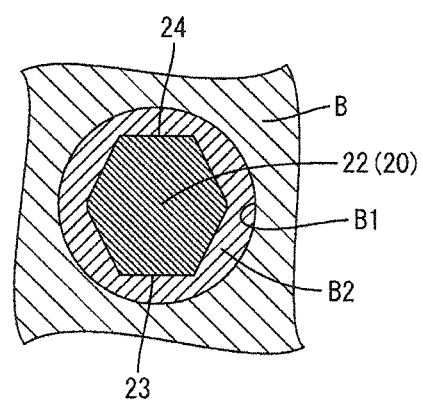
FIG. 9 is a lateral section of a connecting part of a board connecting portion and a through hole in a second embodiment.

A second embodiment of the invention is described with reference to FIG. 9. A terminal 20 in this embodiment has a substantially regular hexagonal cross-section. A wire material as a base material of the terminal 20 is manufactured by being drawn through a substantially regular hexagonal opening of a wire drawing die. After tin plating at least partly is applied to this wire material, the wire material is cut to a specified length and pressed to form the terminal 20. Other configurations, a manufacturing method and effects are similar or substantially the same as in the first embodiment and not repeatedly described.

The terminal includes a board connecting portion 22 and a lower contact surface 23 and an upper contact surface 24 particularly are formed substantially in parallel on this board connecting portion 22. A distance between the lower and upper contact surfaces 23, 24 particularly is less than about 1 mm, for example, 0.64 mm and a cross-sectional area of the board connecting portion 22 is, for example, 0.320 mm2.

Figure 10:
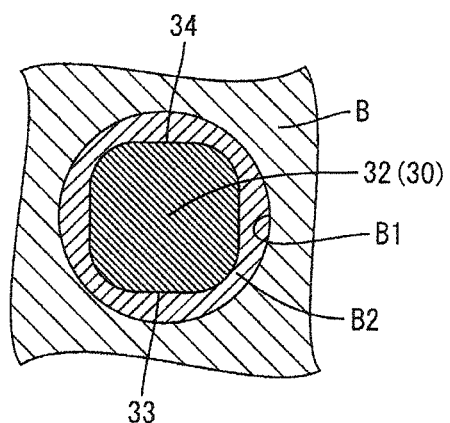
FIG. 10 is a lateral section of a connecting part of a board connecting portion and a through hole in a third embodiment.

A third embodiment of the invention is described with reference to FIG. 10. A terminal 30 in this embodiment has a substantially rectangular cross-sectional shape with rounded corner parts. A wire material as a base material of the terminal 30 is manufactured by being drawn through an opening of a wire drawing die, the opening having a substantially rectangular cross-section with rounded four corners. After tin plating is applied to this wire material, the wire material is cut to a specified length and pressed to form the terminal 30. Other configurations, a manufacturing method and effects are similar or substantially the same as in the first embodiment and not repeatedly described.

The terminal includes a board connecting portion 32 and a lower contact surface 33 and an upper contact surface 34 are formed in parallel on this board connecting portion 32. A distance between the lower and upper contact surfaces 33, 34 particularly is less than about 1 mm, for example, 0.64 mm and a cross-sectional area of the board connecting portion 32 is, for example, 0.375 mm2.

Figure 11:
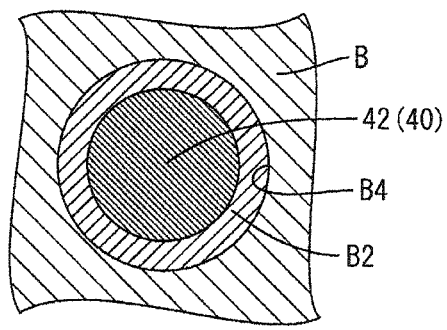
FIG. 11 is a lateral section of a connecting part of a board connecting portion and a through hole in a fourth embodiment.

A fourth particular embodiment of the invention is described with reference to FIG. 11. A terminal 40 in this embodiment substantially has a circular cross-section. A wire material as a base material of the terminal 40 is manufactured by being drawn through a circular opening of a wire drawing die. After tin plating at least partly is applied to this wire material, the wire material is cut to a specified length and pressed to form the terminal 40. Other configurations, a manufacturing method and effects are similar or substantially the same as in the first embodiment and not repeatedly described.

A mating terminal to be connected to the terminal 40 particularly is a cylindrical terminal such as a louver terminal. This cylindrical terminal can come into contact with the terminal 40 substantially over the entire circumference. Note that a diameter of the terminal 40 particularly is less than about 1 mm, for example, 0.64 mm and a diameter of a through hole B4 particularly is less than about 1.1 mm, for example, 0.74 mm.

The invention is not limited to the above described and illustrated embodiments. For example, the following embodiments are also included in the technical scope of the present invention.

Although the regular hexagonal shape and the regular octagonal shape are illustrated as polygonal shapes in the above embodiments, any polygonal shape with obtuse interior angles e.g. polygonal shapes with 5 or more sides/corners can be adopted and the respective interior angles need not be equal according to the present invention.

The dimensions and cross-sectional areas disclosed in the above embodiments are examples and there is not limited to these dimensions and cross-sectional areas.

What is claimed is:

1. A manufacturing method for a terminal including a board connecting portion to be connected to a circular through hole that penetrates through a board, comprising:
   drawing a wire material through a polygonal opening of a wire drawing die to produce a wire material having a polygonal cross-section with obtuse interior angles;
   applying a surface processing to the wire material; shaping the wire material to substantially taper a leading end part of the board connecting portion and removing the surface processing from the leading end portion; and
   cutting the wire material having the surface processing applied thereto to a specified length to form the terminal.

2. The manufacturing method of claim 1, wherein the wire material includes two parallel surfaces.

3. The manufacturing method of claim 1, wherein the surface processing step comprises applying tin plating to the wire material.

4. The manufacturing method of claim 1, wherein the wire material used as a base material is made of copper or copper alloy.

5. The manufacturing method of claim 1, further comprising bending the terminal fitting to substantially have an L shape.

6. A manufacturing method for a terminal including a board connecting portion to be connected to a circular through hole that penetrates through a board, comprising:
   manufacturing a wire material having a substantially rectangular cross-section with rounded corner parts by drawing the wire material through an opening of a wire drawing die, the opening having a substantially rectangular shape with rounded four corners;
   applying a surface processing to the wire material;
   shaping the wire material to substantially taper a leading end part of the board connecting portion and removing the surface processing from the leading end portion; and
   cutting the wire material having the surface processing applied thereto to a specified length to form the terminal.

7. The manufacturing method of claim 6, wherein the wire material includes two parallel surfaces.

8. The manufacturing method of claim 6, wherein the surface processing step comprises applying tin plating to the wire material.

9. The manufacturing method of claim 6, wherein the wire material used as a base material is made of copper or copper alloy.

10. The manufacturing method of claim 6, further comprising bending the terminal fitting to substantially have an L shape.

11. A manufacturing method for a terminal including a board connecting portion to be connected to a circular through hole that penetrates through a board, comprising:
    manufacturing a wire material having a circular cross-section by drawing the wire material through a circular opening of a wire drawing die;
    applying a surface processing to the wire material;
    shaping the wire material to substantially taper a leading end part of the board connecting portion and removing the surface processing from the leading end portion; and
    cutting the wire material having the surface processing applied thereto to a specified length to form the terminal.

12. The manufacturing method of claim 11, wherein the surface processing step comprises applying tin plating to the wire material.

13. The manufacturing method of claim 11, wherein the wire material used as a base material is made of copper or copper alloy.

14. The manufacturing method of claim 11, further comprising bending the terminal fitting to substantially have an L shape.

* * * * *